United States Patent [19]
Chen

[11] Patent Number: 5,266,509
[45] Date of Patent: Nov. 30, 1993

[54] FABRICATION METHOD FOR A FLOATING-GATE FIELD-EFFECT TRANSISTOR STRUCTURE

[75] Inventor: Tey-Yi J. Chen, Cuppertino, Calif.

[73] Assignee: North American Philips Corporation, New York, N.Y.

[21] Appl. No.: 27,545

[22] Filed: Mar. 5, 1993

Related U.S. Application Data

[63] Continuation of Ser. No. 903,591, Jun. 24, 1992, abandoned, which is a continuation-in-part of Ser. No. 522,432, May 11, 1990, abandoned.

[51] Int. Cl.$^5$ .......................................... H01L 21/265
[52] U.S. Cl. .................................... 437/43; 437/195
[58] Field of Search .................. 437/41, 42, 43, 52, 437/195

[56] References Cited

U.S. PATENT DOCUMENTS

| | | | |
|---|---|---|---|
| 4,376,947 | 3/1983 | Chiu et al. | 357/23.5 |
| 4,426,764 | 1/1984 | Kosa et al. | 29/571 |
| 4,455,568 | 6/1984 | Shiota | 357/23.5 |
| 4,458,407 | 7/1984 | Hoeg, Jr. et al. | 357/23.5 |
| 4,466,081 | 8/1984 | Masuoka | 365/218 |
| 4,524,508 | 6/1985 | Sato | 437/195 |
| 4,616,402 | 10/1986 | Mori | 437/195 |
| 4,720,323 | 1/1988 | Sato . | |
| 4,763,177 | 8/1988 | Paterson | 357/23.5 |
| 4,881,108 | 11/1989 | Yoshikawa | 357/23.5 |
| 4,935,378 | 6/1990 | Mori | 437/195 |
| 5,006,481 | 4/1991 | Chan et al. | 437/195 |
| 5,124,280 | 6/1992 | Wei et al. | 437/195 |
| 5,175,118 | 12/1992 | Yoneda | 437/41 |
| 5,179,034 | 1/1993 | Mori et al. | 437/41 |
| 5,210,044 | 5/1993 | Yoshikawa | 437/43 |
| 5,210,047 | 5/1993 | Woo et al. | 437/43 |

FOREIGN PATENT DOCUMENTS

| | | |
|---|---|---|
| 0187278 | 7/1986 | European Pat. Off. . |
| 301460 | 2/1989 | European Pat. Off. ........... 357/23.5 |
| 46528 | 2/1987 | Japan .................. 437/43 |
| 48045 | 3/1987 | Japan .................. 437/43 |
| 96950 | 4/1989 | Japan .................. 437/42 |

Primary Examiner—Brian E. Hearn
Assistant Examiner—Linda J. Fleck
Attorney, Agent, or Firm—David Schreiber

[57] ABSTRACT

A stacked floating-gate field-effect transistor ("FET") structure suitable for memory cells in a nonvolatile memory is fabricated according to a process in which a floating-gate layer is formed on a semiconductor substrate (30), oxide (42) is formed along the sidewalls (35) of the floating gate (18) extending in the channel-length direction, and an oxide-nitride-oxide ("ONO") composite layer (44) is formed along the top of the structure, including the floating gate and the sidewall oxide. The ONO composite layer and the sidewall oxide act as an isolation dielectric between the floating gate and a control gate (20) formed on top of the ONO layer.

12 Claims, 3 Drawing Sheets

FABRICATION METHOD FOR A FLOATING-GATE FIELD-EFFECT TRANSISTOR STRUCTURE

CROSS REFERENCE TO RELATED APPLICATION

This is a continuation of application Ser. No. 07/903,591, filed Jan. 24, 1992, abandoned, which is a continuation-in-part of U.S. patent application Ser. No. 522,432 filed 11 May 1990, abandoned.

FIELD OF USE

The present invention relates to a floating-gate field-effect transistor ("FET") structure for use in nonvolatile semiconductor memories or similar devices. This invention also relates to a method for manufacturing such a structure.

BACKGROUND ART

A nonvolatile semiconductor memory, such as an erasable programmable read-only memory of the UV-erasable or electrically erasable type, is a device that can retain data when power is removed from the memory. This function is performed with a group of memory-cell structures that store electronic charge. An example of the charge-storage structure is a stacked floating-gate FET in which a regular control gate is situated over an insulation-surrounded floating gate. When a voltage is applied to the control gate, charge is typically injected from the channel region of the FET onto the floating gate where the charge can be stored for a long time after the applied voltage is removed.

The floating gate must be surrounded by a dielectric film with good isolation properties to insure that the charge is retained. One type of dielectric film consists of (a) a thin oxide-nitride-oxide ("ONO") composite layer situated between the floating and control gates and (b) a thermally grown oxide on the sidewalls of the floating gate. The thin ONO layer is used not only to isolate the floating gate but also to couple high voltage from the control gate to the floating gate. The thermal oxide on the sidewalls of the floating gate is used mainly as the isolation dielectric between the two gates.

To provide good electric isolation, the sidewall oxide generally has to be grown at a fairly high temperature, usually in excess of 1050° C. Also, the corners formed between the ONO and the sidewall oxide are likely to be potential weak points for charge leakage in the standard stacked-gate cell design. These concerns impose severe restrictions in scaling down memory device size. As devices are scaled down, the temperature to which they are exposed during formation must be minimized in order to insure the integrity of the thin gate oxide used in the memory cells. The high oxidation temperature required to form the sidewall oxide becomes a major concern. Furthermore, the ONO layer has to be thinned down to maintain the coupling efficiency between the control and floating gates as the gate oxide thickness is reduced. This increases the likelihood of corner leakage between the ONO layer and sidewall oxide.

Prior techniques for insulating a floating gate from a control gate in a semiconductor memory are illustrated in Sato U.S. Pat. 4,720,323. Sato discloses a first technique in which an ONO composite layer is formed along the top of the floating gate and along the sidewalls of the floating gate extending in channel-length direction. In a second technique disclosed in Sato, an ONO layer is formed along the top of the floating gate. Oxide is subsequently provided along the floating-gate sidewalls extending in the channel-length direction. In both techniques, oxide is provided along the floating-gate sidewalls extending in the channel-width direction.

Both of these techniques suffer from the previously discussed drawbacks. In the first technique, the only oxide lying on the sides of the floating gate extending in the channel-length direction is the small thickness of the lower layer of the ONO layer. This increases the likelihood of corner leakage between the floating and control gates. In the second technique, a fairly thick layer of oxide must be formed along the exposed gate sidewalls extending in the channel-length direction. Doing so normally requires that the gate oxide be exposed to high temperatures for an extended period of time which, in the case of scaled-down devices, could damage the integrity of the thin gate oxide.

What is needed in view of these drawbacks is a process by which scaled-down nonvolatile semiconductor memories can be formed without directly exposing the gates of the memory cells to excessive temperatures for extended periods of time while still enabling the floating gate in each cell to be properly isolated from the control gate.

GENERAL DISCLOSURE OF THE INVENTION

It is therefore an object of the present invention to provide a method for manufacturing semiconductor structures, such as nonvolatile semiconductor memories, which does not expose the elements of the structures to excessive temperatures for extended periods of time.

It is another object of the invention to provide a nonvolatile floating-gate FET structure which provides superior electrical isolation of the structure's floating and control gates.

These and other objects of the invention are achieved with a stacked control/floating-gate FET structure, and a method for manufacturing this structure, in which the floating gate is isolated from the control gate by first forming a thin layer of oxide along the sidewalls of the floating gate extending in the channel-length direction, and then covering the oxide layer and the top of the floating gate with an ONO composite layer. The sidewall oxide layer is preferably formed by a thermal oxidation step and is relatively thin so that the floating gate does not have to be exposed to a high oxidation temperature for an extended period of time.

After creating the sidewall oxide, the first layer of oxide for the ONO composite layer is grown over the floating gate and sidewall oxide, preferably in a second thermal oxidation step which again does not expose the floating gate to excessive temperatures for an extended time. Now that the floating gate is completely covered with oxide, the remaining nitride and oxide layers of the ONO layer can be formed. Finally, a control gate is formed on the ONO layer. The top corners of the floating gate are now surrounded both by the ONO layer and the underlying oxide layer which provide improved dielectric isolation between the floating and control gates. This process also helps prevent formation of a silicon trench in certain areas of the structure during gate-patterning steps.

DESCRIPTION OF THE PREFERRED EMBODIMENTS

Figure 1:
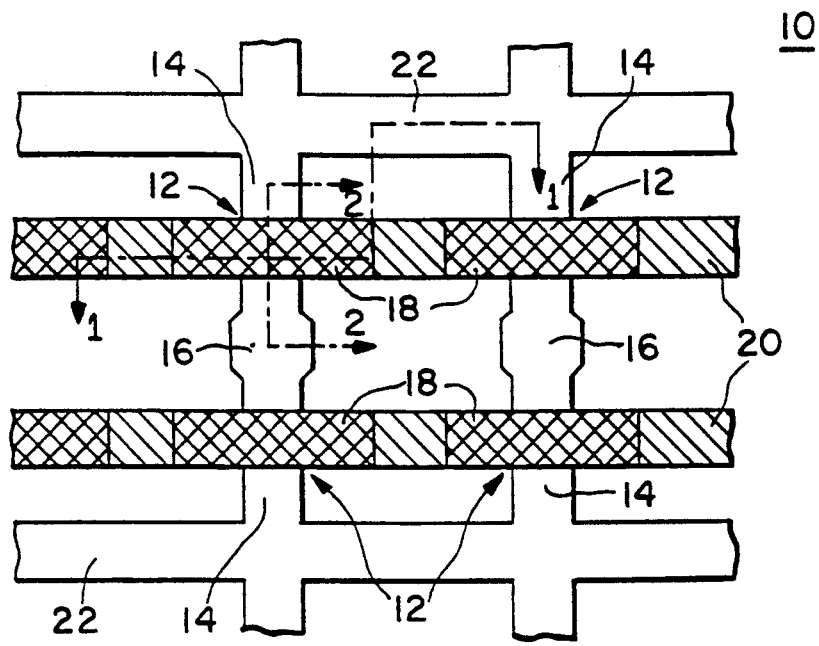
FIG. 1 is a schematic plan view of a floating-gate FET memory array in accordance with the invention.

Referring to the drawings, FIG. 1 shows the basic layout of a stacked floating-gate FET memory array 10 which includes a plurality of FET memory cells 12, a plurality of n-type source regions 14, and a plurality of n-type drain regions 16. In each memory cell 12, source 14 and drain 16 are separated by a channel. The channel-length direction—i.e., the direction from source 14 to drain 16 (or vice-versa) in that cell 12—runs vertically in FIG. 1. The channel-width direction runs horizontally in FIG. 1.

First layers 18 of n-type polycrystalline silicon ("polysilicon") for the floating gates of memory cells 12 overlie source and drain regions 14 and 16. Second layers 20 of n-type polysilicon for the control gates of memory cells 12 overlie floating-gate polysilicon layers 18. If desired, polysilicon control-gate layers 20 can be replaced with a "polycide" structure—i.e., a lower layer of n-type polysilicon and an upper layer of a suitable metal silicide—to enhance the circuit speed.

As indicated below, the shape for floating-gate polysilicon layers 18 is created in two steps. The floating-gate polysilicon is first shaped into lines that extend in the channel-length direction. Later, these polysilicon lines are patterned into rectangles to form the final shape for floating-gate layers 18 as shown in FIG. 1. Items 22 in FIG. 1 indicate the small parts of source regions 14 not covered by floating-gate polysilicon lines 18 between these two shaping steps.

Figure 2:
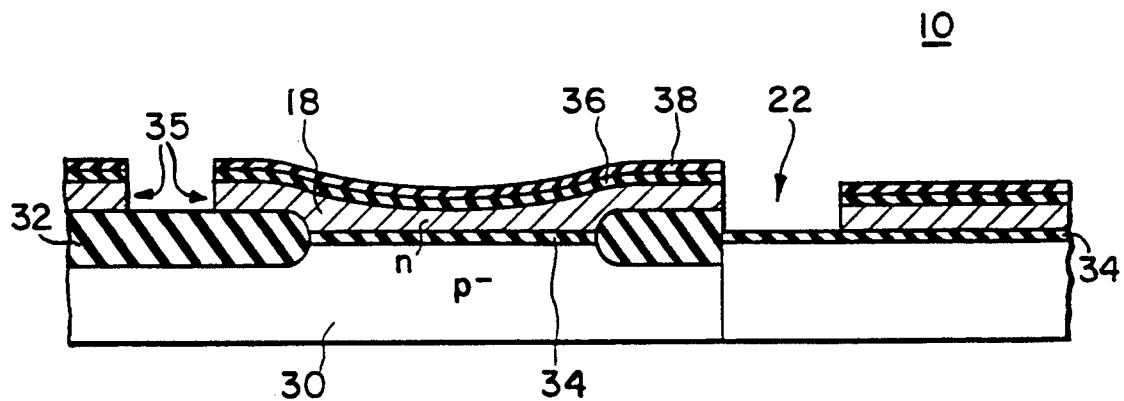
FIGS. 2, 3, 4, 5, 6, and 7 are cross-sectional structural views taken along stepped line 1—1 of FIG. 1 for illustrating steps in manufacturing a floating-gate FET according to the invention.

FIGS. 2—7, illustrate steps in fabricating one of floating-gate FET memory cells 12 in accordance with the teachings of the present invention. FIG. 2 also shows one of uncovered source diffusion areas 22. The starting point for manufacturing memory cell 12 in FIG. 2 is a lightly doped p-type (100) monocrystalline silicon substrate 30 on which are formed by conventional semiconductor fabrication techniques a silicon-dioxide field-insulation region 32 and a silicon-dioxide gate dielectric layer 34.

A blanket layer of polysilicon is deposited on top of field-oxide region 32 and gate dielectric 34 after which the blanket polysilicon layer is doped n-type. A thermal oxidation is performed to grow a layer of silicon dioxide along the upper surface of the n-type polysilicon. A layer of silicon nitride is then deposited according to an LPCVD technique on the just-formed oxide layer. Using a photoresist mask (not shown), conventional plasma etch techniques are employed to pattern the polysilicon, overlying oxide, and nitride respectively into polysilicon lines 18, pad oxide layers 36, and nitride layers 38 as depicted in FIG. 2.

At the stage shown in FIG. 2, polysilicon floating-gate lines 18 extend over gate dielectric 34 and adjoining field-oxide region 32 in the channel-length direction—i.e., perpendicular to the plane of FIG. 2. Polysilicon line 18 in the middle portion of FIG. 2 thus has a pair of exposed sidewalls, represented as items 35, that run in the channel-length direction. The preferred thicknesses of gate oxide 34, floating-gate polysilicon 18, pad oxide 36, and nitride 38 are 10–20 nm, 200–250 nm, 10 nm, and 15–30 nm, respectively.

Figure 3:
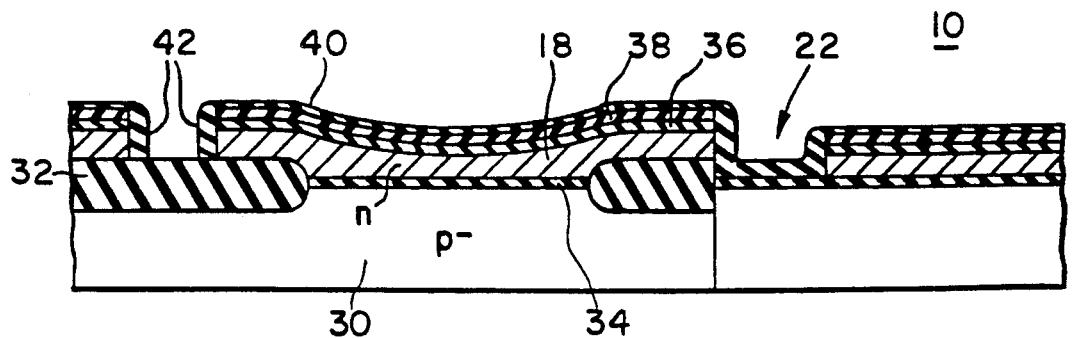

Turning now to FIG. 3, it illustrates a key step of the invention in which a thermal oxidation is performed at a temperature between 850° C. and 950° C. for 5 to 30 minutes to grow a thin silicon-dioxide isolation layer 40 along the top of nitride 38, along the sidewalls of floating-gate lines 18, and along the top of substrate 30 at uncovered source area 22. Either wet or dry oxidation may be used. Items 42 in FIG. 3 are the portions of oxide layer 40 formed along sidewalls 35 of central line 18. The thickness of oxide layer 40 is around 1 nm along the top of nitride 38. Depending on the oxidation temperature and type (i.e., wet or dry), the thickness of sidewall oxide regions 42 is 40–80 nm. The thickness of oxide layer 40 is approximately 40 nm along the top of substrate 30 at area 22.

Figure 4:
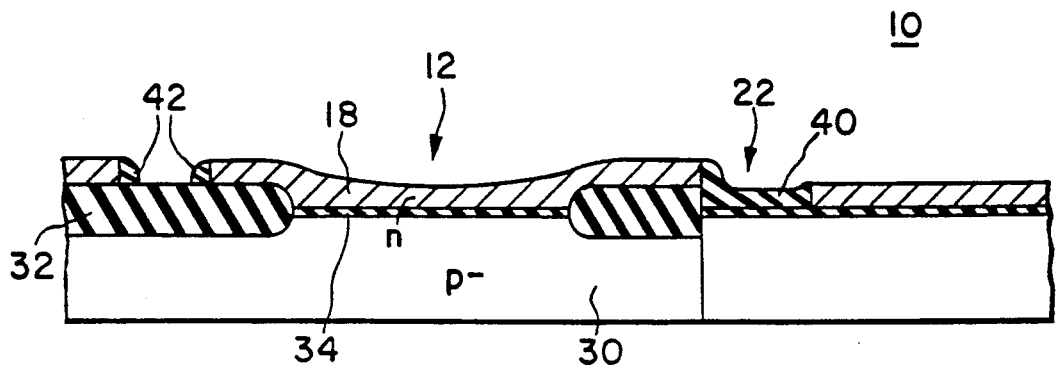

Next, as illustrated in FIG. 4, oxide, nitride, and oxide layers 36, 38 and, 40 in memory cell 12 are etched in such a way that only sidewall oxide regions 42 and the portion of oxide layer 40 at area 22 remain. In particular, the undesired parts of oxide layer 40 are first removed using a suitable etchant, such as a hydrofluoric acid solution. Nitride layer 38 is then removed by exposing it to hot (e.g., 150° C.) phosphoric acid for approximately 20 minutes. Finally, another hydrofluoric etchant solution is employed to remove oxide layer 36 and 200–250 angstroms of sidewall oxide regions 42. This typically leaves the thickness of sidewall regions 42 at 350–400 angstroms.

An oxide-nitride-oxide composite insulating layer 44 is now formed along the entire top surface of memory array 10. The ONO composite layer 44 consists of a lower silicon-dioxide layer 46, an intermediate silicon-nitride layer 48, and an upper silicon-dioxide layer 50 formed in three corresponding steps.

Lower oxide layer 46 is thermally grown at a temperature between 950° C. and 1100° C. to a thickness of 10–15 nm. This step takes approximately 10 minutes, depending on the temperature, and is preferably done in an environment of dry oxygen with 3% chlorine. The 950° C.–1100° C. range is chosen because it balances the desire to achieve high-quality silicon dioxide, which occurs at the higher temperature, with the desire to reduce the temperature exposure of floating-gate polysilicon 18. If the latter is of primary concern, 950° C. is the most preferred temperature.

Strictly speaking, silicon dioxide forms only at the silicon surface when a thermal oxidation is done on a silicon body. If the body already has a silicon-dioxide coat, the newly created oxide grows along the silicon surface below the earlier created oxide and pushes the earlier oxide outward. Thus, the portion of oxide 46 that is shown as covering sidewall oxide 42 is not actually new oxide but, instead, is a displaced part of region 42. However, it makes no difference here whether this portion of layer 46 is new or old oxide. For simplicity in claiming the invention, this disclosure uses the convention in which thermally grown oxide is treated as being a fully external coat during its formation. Note that layer 46 would truly be a fully external oxide coat during its formation if it were deposited rather than being thermally grown.

Nitride layer 48 is then deposited at approximately 800° C. for 10 minutes to a thickness of approximately 15 nm. Due to the presence of sidewall oxide regions 42, the total thickness of oxide sandwiched between nitride layer 48 and either sidewall 35 is greater than the total average thickness of oxide sandwiched between nitride layer 48 and the top of floating-gate line 18. Finally, another thermal oxidation is performed in wet oxygen at 900°–1000° C. for 2 hours to form oxide layer 50 to a thickness of 2–3 nm. Oxide layer 50 further improves the dielectric quality of ONO composite layer 44.

Figure 5:
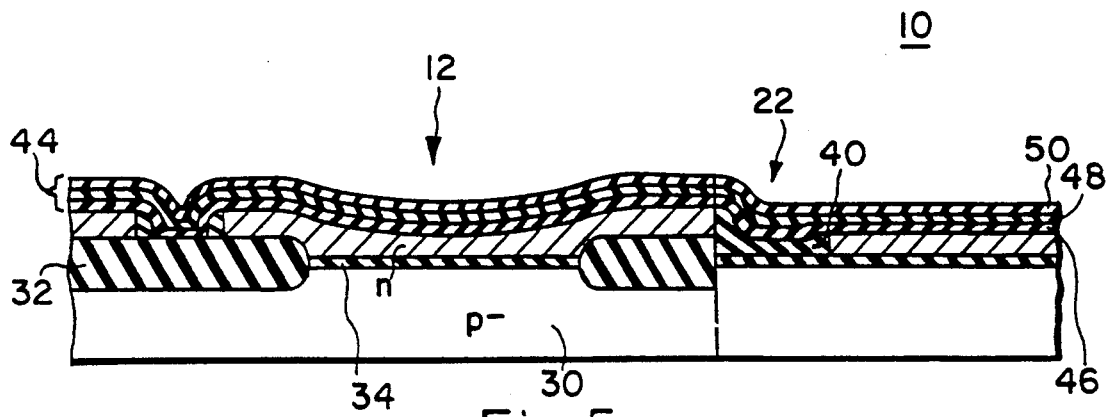

The steps illustrated in FIGS. 4 and 5 provide a number of advantages over prior fabrication techniques. Firstly, the combination of sidewall oxide regions 42 and overlying ONO layer 44 provides superior electrical isolation and helps insure that, as the thicknesses of the various layers are reduced to accommodate high-density scaled-down technology, leakage currents will not pass from floating gate 18 through insulating layers 42 and 44. Secondly, sidewall oxide regions 42 do not have to provide as much electrical isolation as in prior devices since ONO layer 44 also provides electrical isolation in these areas. As a result, sidewall oxide regions 42 can be grown at a lower temperature. This facilitates scaling down of memory array 10.

Also, source areas 22—i.e., the portions of source regions 14 not covered by floating-gate lines 18—are now covered by ONO layer 44 as well as by oxide 40 grown during the sidewall oxidation step. The silicon trench that often forms in areas such as areas 22 during later etching steps can be prevented in this manner. To further insure that a trench will not form, an n+ implantation of arsenic in the form of As+ can be made into areas 22 before the sidewall oxidation step. This causes oxide layer 40 to grow thicker over the implanted area and further prevents later silicon trench formation.

Figure 6:
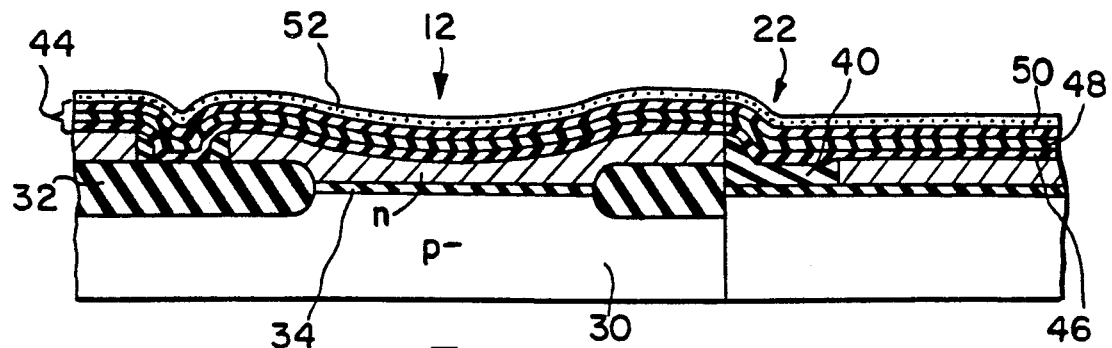

Largely conventional steps are now employed to complete fabrication of memory array 10. In particular, a thin blanket amorphous silicon layer 52 approximately 30 nm thick is deposited on ONO layer 44 to protect it from damage by photoresist used in later operations pertinent to creating devices in the peripheral area. FIG. 6 shows the structure at this point.

Figure 7:
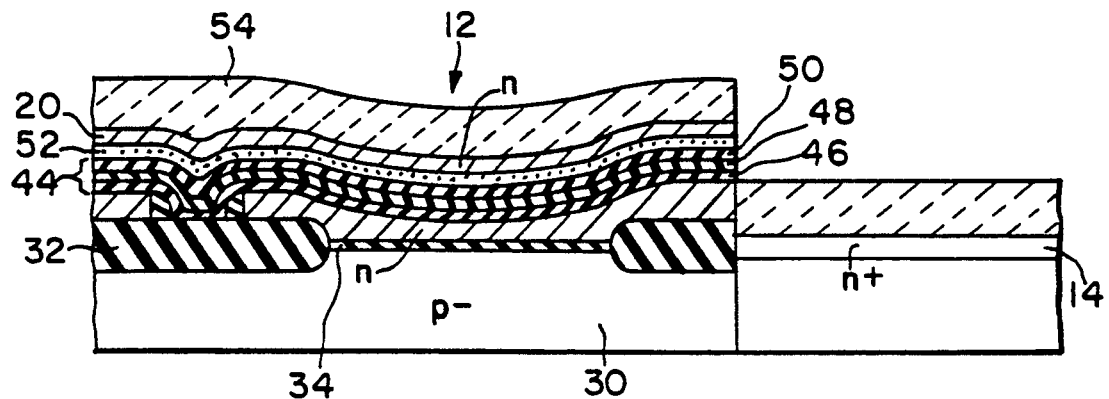

A blanket layer of polysilicon is deposited on layer 52 to create a composite amorphous silicon/polysilicon layer having a thickness of 400–450 nm. This composite non-monocrystalline silicon layer is then doped n-type. Using a suitable photoresist mask (not shown), the composite non-monocrystalline silicon layer is patterned with a suitable plasma etchant to form polysilicon control-gate layer 20 as shown in FIG. 7, advantage being taken of the fact that the amorphous silicon converts to polysilicon during heat treatments in the remainder of the fabrication process. With this photoresist mask still in place, ONO layer 44 is patterned after which polysilicon floating-gate line 18 is further patterned to convert it into a rectangle.

Source and drain regions 14 and 16 are now formed in substrate 30, typically by ion implantation and anneal. Finally, an insulating layer 54 of borophosphosilicate glass is deposited on top of the structure.

Figure 8:
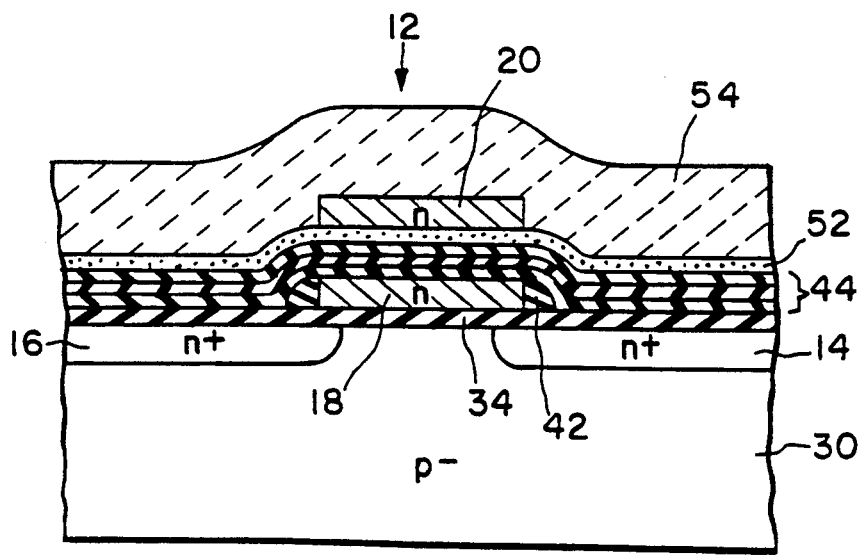
FIG. 8 is a cross sectional view taken along line 2—2 of FIG. 1 for showing a completed FET structure in accordance with the invention.

Moving to FIG. 8, it shows how completed memory cell 12 appears in a vertical plane perpendicular to the vertical plane of the left-hand and central parts of FIG. 7. Items 56 in FIG. 8 are a pair of sidewall oxide regions provided along the sidewalls of gate layers 18 and 20 extending in the channel-width direction.

Although the invention has been described in terms of preferred embodiments, numerous variations and modifications could be made without departing from the scope of the invention as set forth in the following claims. For example, "salicide" process technology—i.e., self-aligned silicide technique—could be used in fabricating memory cells 12. The conductivities could be reversed to form p-channel floating-gate FETs instead of n-channel cells. Finally, gate dielectric layer 34 could be formed out of silicon nitride instead of oxide.

I claim:

1. A method for manufacturing a floating-gate field-effect transistor in which a channel separates a source and a drain in a semiconductor substrate so as to establish a channel-length direction, the method comprising the steps of:

forming a floating-gate layer over a gate dielectric layer situated along the substrate, the floating-gate layer having a top surface and a pair of opposing first sidewalls that extend in the channel-length direction;

forming a pair of sidewall oxide layers respectively along the first sidewalls of the floating-gate layer;

subsequently separately forming a composite oxide-nitride-oxide ("ONO") layer along the sidewall oxide layers and along the top surface of the floating-gate layer;

forming a control gate over the ONO layer; and forming the source and drain.

2. A method as in claim 1 wherein the step of forming the sidewall oxide layers entails thermally growing oxide along the first sidewalls of the floating-gate layer.

3. A method as in claim 2 wherein the step of thermally growing oxide is performed at a temperature no greater than approximately 950° C.

4. A method as in claim 2 further including the steps of:

providing a nitride layer over the top surface of the floating gate layer, but not along its first sidewalls, prior to the step of thermally growing oxide; and removing the nitride layer prior to the step of forming the ONO layer.

5. A method as in claim 4 further including the step of providing a pad oxide layer along the top surface of the floating-gate layer below the nitride layer prior to the step of thermally growing oxide.

6. A method as in claim 5 further including the step of removing the pad oxide layer prior to the step of forming the ONO layer.

7. A method as in claim i wherein the step of forming the ONO layer comprises the steps of:

thermally growing a lower oxide layer along the sidewall oxide layers and along the top surface of the floating gate layer;

depositing a nitride layer on the lower oxide layer; and thermally growing an upper oxide layer along the nitride layer.

8. A method as in claim 7 wherein the steps of growing the lower and upper oxide layers are respectively performed at temperatures no greater than approximately 1100° C. and 1000° C.

9. A method as in claim 8 wherein the step of forming the sidewall oxide layers entails thermally growing oxide along the first sidewalls of the floating-gate layer at a temperature no greater than approximately 950° C.

10. A method as in claim 7 wherein the semiconductor substrate, the oxide layers, and the nitride layer respectively consist principally of silicon, silicon oxide, and silicon nitride.

11. A method as in claim 7 wherein the total average thickness of oxide sandwiched between the nitride layer and either first sidewall of the floating-gate layer is greater than the total average thickness of oxide sandwiched between the nitride layer and the top surface of the floating-gate layer.

12. A method as in claim 1 further including, prior to the step of forming the sidewall oxide layers, the step of introducing a semiconductor impurity of the same conductivity type as the source and drain into the portion of the region for the source not covered by the floating-gate layer.

* * * * *